(12) United States Patent
    Fukuchi

(10) Patent No.: US 9,929,712 B2
(45) Date of Patent: Mar. 27, 2018

(54) MULTILAYER SUBSTRATE

(71) Applicant: TOSHIBA MEMORY CORPORATION, Minato-ku (JP)

(72) Inventor: Satoru Fukuchi, Chigasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 63 days.

(21) Appl. No.: 15/255,410

(22) Filed: Sep. 2, 2016

(65) Prior Publication Data

US 2017/0264260 A1    Sep. 14, 2017

Related U.S. Application Data

(60) Provisional application No. 62/306,428, filed on Mar. 10, 2016.

(51) Int. Cl.
| | |
|---|---|
| *H01P 3/08* | (2006.01) |
| *H03H 7/42* | (2006.01) |
| *H01L 23/498* | (2006.01) |
| *H01L 23/66* | (2006.01) |
| *H05K 1/02* | (2006.01) |

(52) U.S. Cl.
    CPC ....... *H03H 7/427* (2013.01); *H01L 23/49822* (2013.01); *H01L 23/49827* (2013.01); *H01L 23/66* (2013.01); *H01P 3/081* (2013.01); *H05K 1/0245* (2013.01); *H01L 2223/6627* (2013.01); *H01L 2223/6661* (2013.01); *H05K 2201/09272* (2013.01); *H05K 2201/09727* (2013.01)

(58) Field of Classification Search
    CPC . H01P 3/08; H01P 3/081; H01P 3/082; H05K 1/0245; H01L 23/64
    USPC ............................ 333/33, 238, 246, 1, 4, 5
    See application file for complete search history.

(56) References Cited

U.S. PATENT DOCUMENTS

| | | | |
|---|---|---|---|
| 7,345,555 B2 * | 3/2008 | Yamanaga | H01P 5/02 333/12 |
| 7,564,695 B2 | 7/2009 | Matsumoto | |
| 8,587,385 B2 * | 11/2013 | Umeda | H05K 1/0245 333/33 |
| 8,742,868 B2 * | 6/2014 | Wu | H01P 3/026 333/238 |

(Continued)

FOREIGN PATENT DOCUMENTS

| | | |
|---|---|---|
| JP | 2003-152290 | 5/2003 |
| JP | 2005-175078 | 6/2005 |
| JP | 2007-287750 | 11/2007 |

(Continued)

*Primary Examiner* — Stephen E Jones
(74) *Attorney, Agent, or Firm* — Oblon, McClelland, Maier & Neustadt, L.L.P.

(57) ABSTRACT

According to one embodiment, there is provided a multilayer substrate including a signal layer. The signal layer includes a first line and a second line which form a differential pair. The first line electrically connects a first node and a second node in the signal layer. The second line electrically connects a third node and a fourth node in the signal layer. The interval between the first line and the second line is approximately constant from the first node to the second node. A physical length from the third node to the fourth node in the second line is shorter than a physical length from the first node to the second node in the first line. A width of the second line is thicker than a width of the first line.

20 Claims, 7 Drawing Sheets

(56) References Cited

U.S. PATENT DOCUMENTS 9,795,027 B2 * 10/2017 Watanabe ............ H05K 1/0225

FOREIGN PATENT DOCUMENTS

| | | |
|---|---|---|
| JP | 2011-210760 | 10/2011 |
| JP | 4848490 | 12/2011 |
| JP | 4964090 | 6/2012 |
| JP | 5004871 | 8/2012 |

* cited by examiner

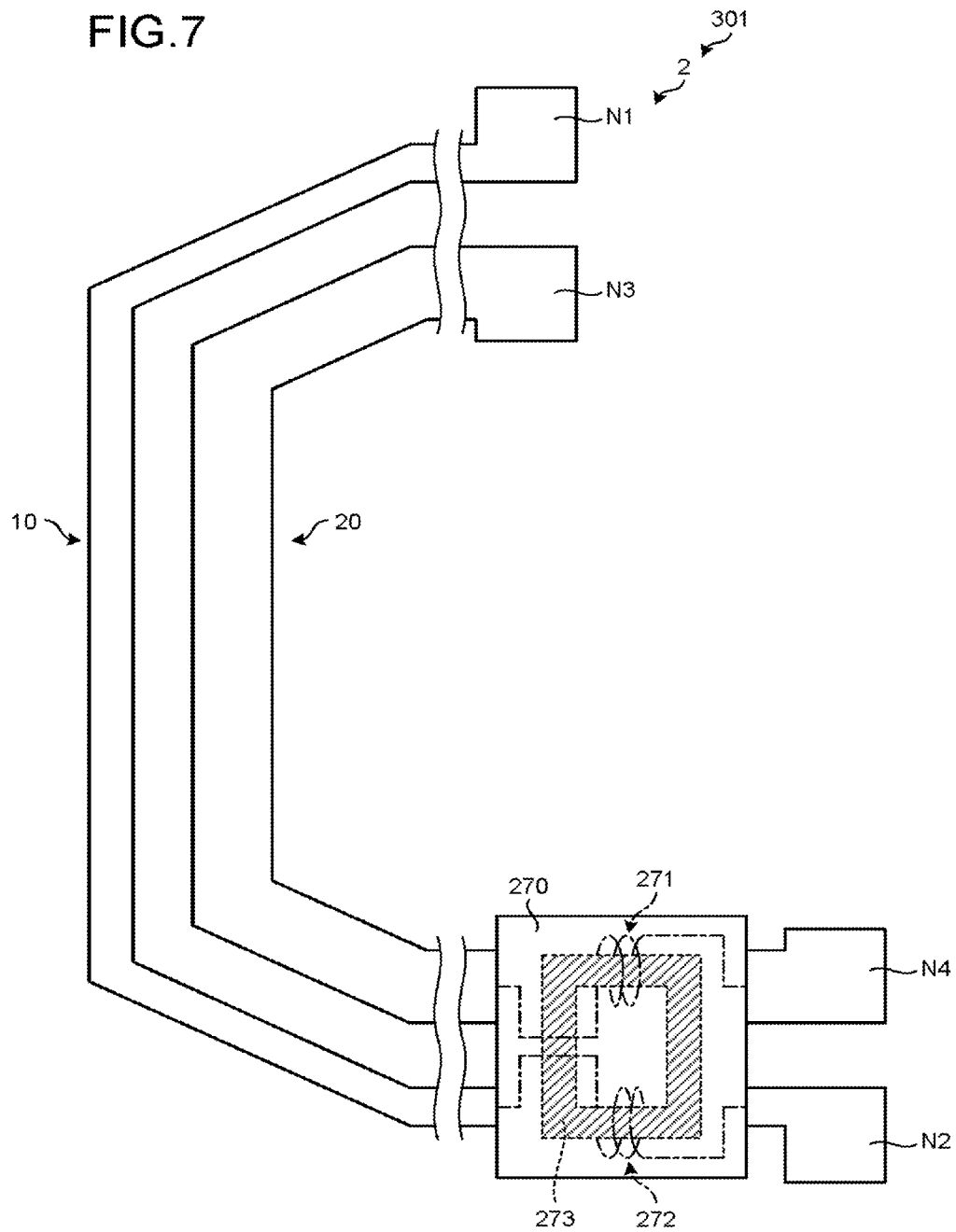

MULTILAYER SUBSTRATE

CROSS-REFERENCE TO RELATED APPLICATIONS

This application is based upon and claims the benefit of priority from U.S. Provisional Application No. 62/306,428, filed on Mar. 10, 2016; the entire contents of which are incorporated herein by reference.

FIELD

Embodiments described herein relate generally to a multilayer substrate.

BACKGROUND

In a multilayer substrate, two lines, which form a differential pair, may be provided in a signal layer. At this time, it is desired to suppress deterioration in differential characteristics of the two lines.

BRIEF DESCRIPTION OF THE DRAWINGS

FIG. 7 is a plan view illustrating a configuration of a multilayer substrate according to another modification example of the embodiment.

DETAILED DESCRIPTION

In general, according to one embodiment, there is provided a multilayer substrate including a signal layer. The signal layer includes a first line and a second line which form a differential pair. The first line electrically connects a first node and a second node in the signal layer. The second line electrically connects a third node and a fourth node in the signal layer. The interval between the first line and the second line is approximately constant from the first node to the second node. A physical length from the third node to the fourth node in the second line is shorter than a physical length from the first node to the second node in the first line. A width of the second line is thicker than a width of the first line.

Exemplary embodiments of a multilayer substrate will be explained below in detail with reference to the accompanying drawings. The present invention is not limited to the following embodiments.

Embodiment

Figure 1:
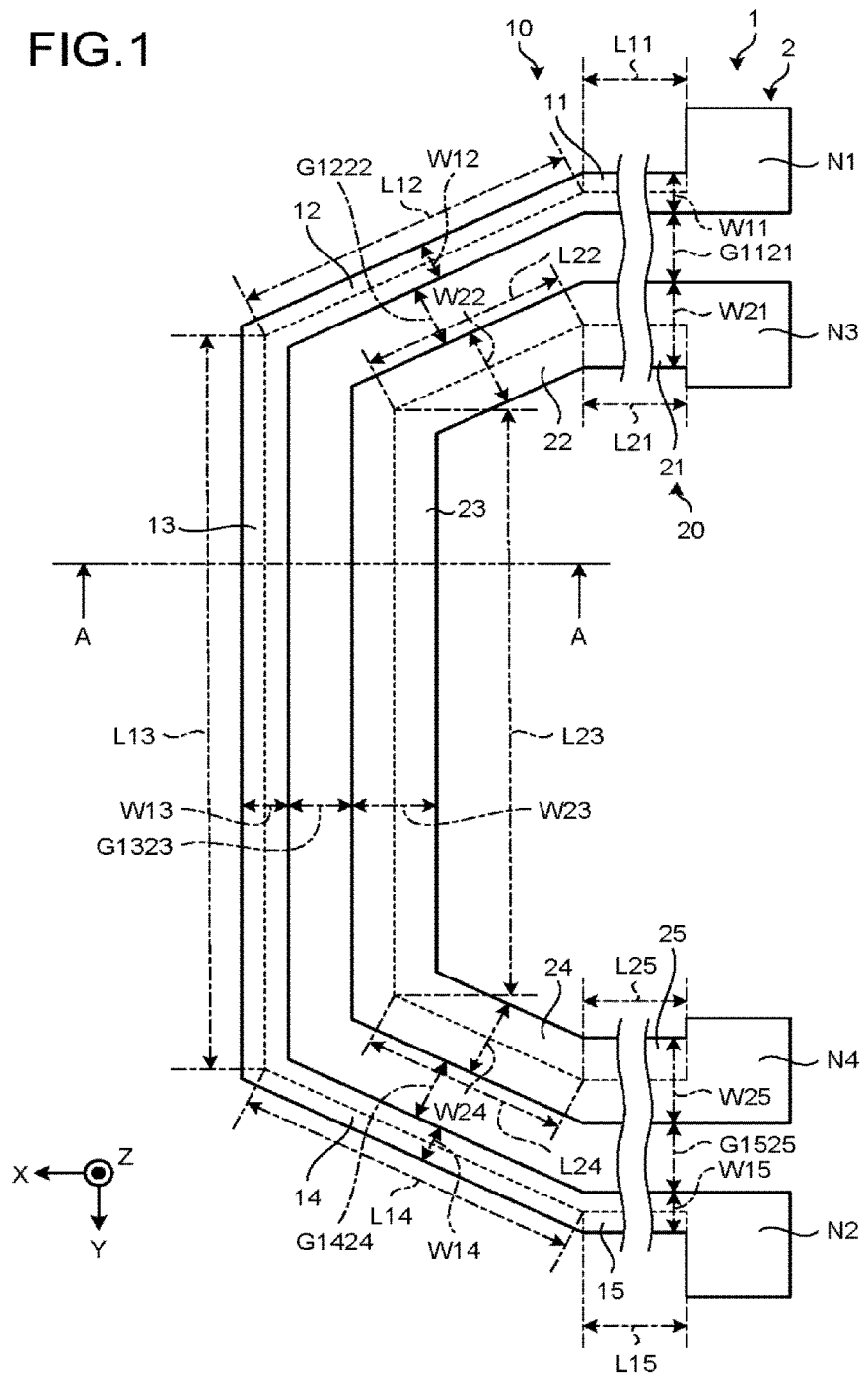
FIG. 1 is a plan view illustrating a configuration of a multilayer substrate according to an embodiment.
Figure 2:
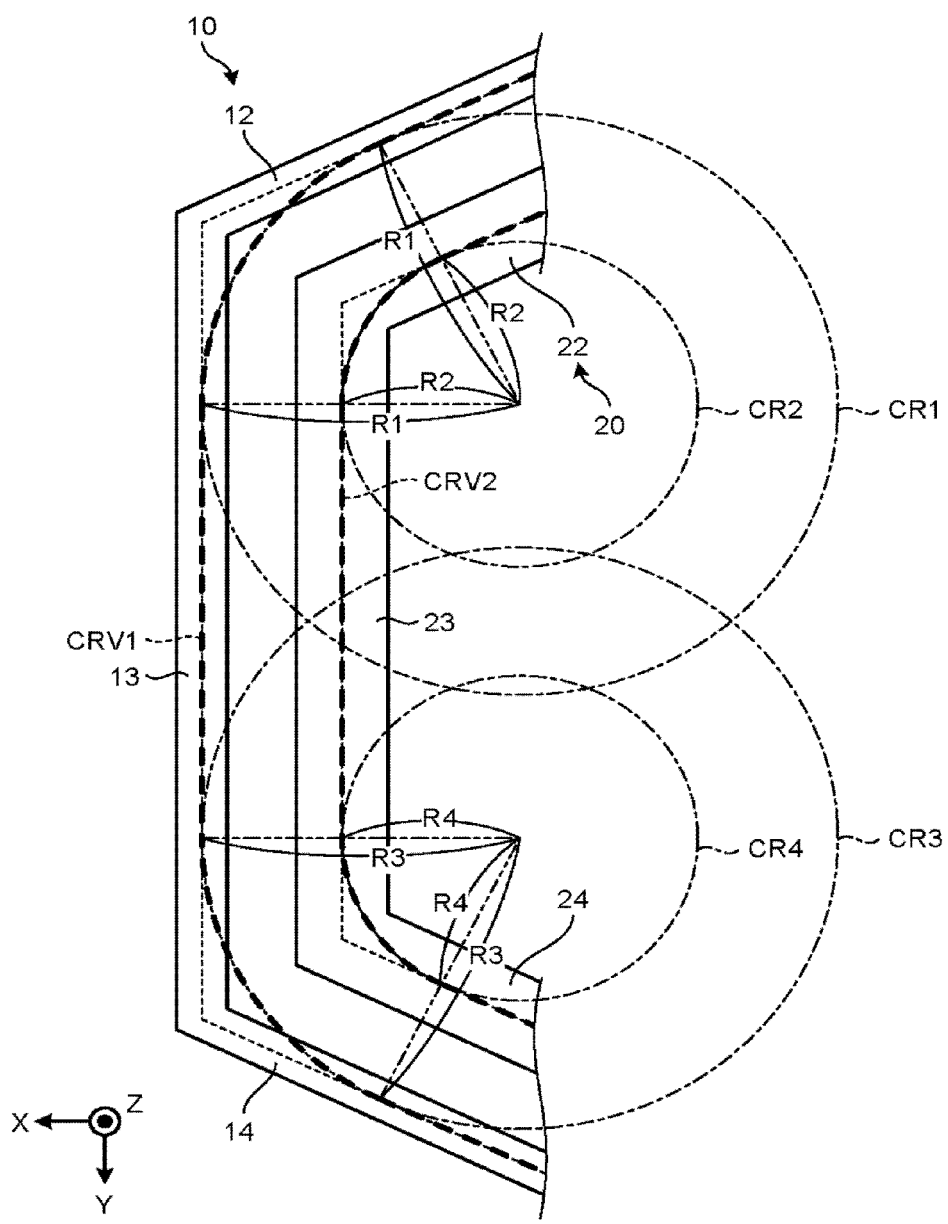
FIG. 2 is a plan view illustrating a radius of curvature of a signal line in the embodiment.
Figure 3:
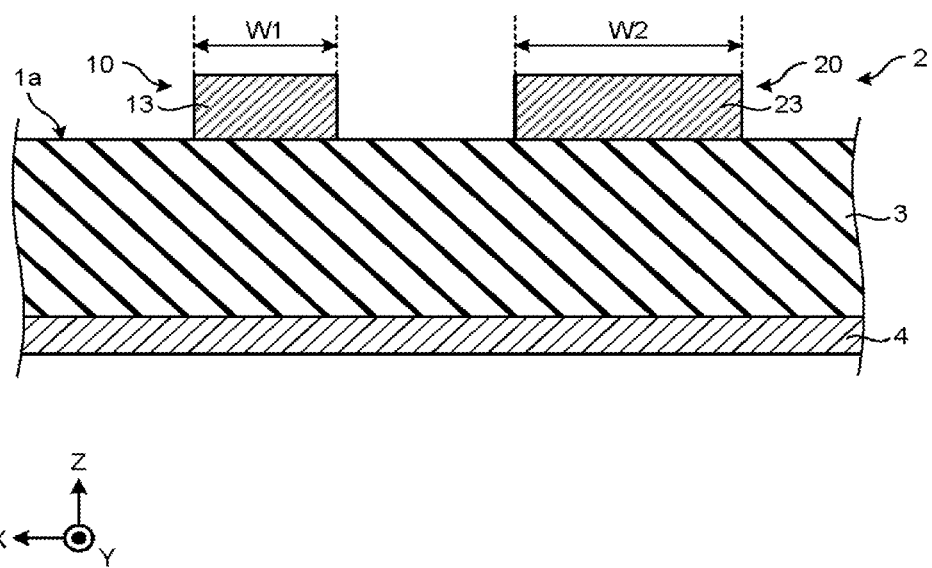
FIG. 3 is a cross-sectional view illustrating a width of the signal line in the embodiment.

A multilayer substrate 1 according to this embodiment will be described with reference to FIG. 1 to FIG. 3. FIG. 1 is a plan view illustrating a configuration of the multilayer substrate 1. FIG. 2 is a plan view illustrating a radius of curvature of a signal line. FIG. 3 is a cross-sectional view illustrating a width of the signal line. FIG. 3 is a cross-sectional view taken along line A-A in FIG. 1. In FIG. 1 to FIG. 3, a direction, which is approximately perpendicular to a surface 1a of the multilayer substrate 1, is set as a Z direction, and two directions, which are perpendicular to each other in a plane perpendicular to the Z direction, are set as an X direction and a Y direction.

The multilayer substrate 1 can be a substrate that deals with a radio-frequency signal, and may be configured as a semiconductor device (semiconductor package) in a state in which a semiconductor chip (not illustrated) is mounted on the multilayer substrate 1, or may be configured as a radar that receives a radio wave in a state in which a microstrip antenna (not illustrated) is disposed on the multilayer substrate 1. In a case of transmitting the radio-frequency signal at the inside of the multilayer substrate 1, when the radio-frequency signal is transmitted in an aspect of a differential signal, an improvement in noise resistance can be expected.

In the multilayer substrate 1, as illustrated in FIG. 3, a signal layer 2 may be stacked on an upper side of a ground layer 4 with an insulating layer 3 interposed therebetween. The ground layer 4 has a planar pattern that extends in a planar shape, and the planar pattern can be formed from, for example, a material that contains a conductor such as copper as a main component. For example, the insulating layer 3 can be formed from a material that contains an insulating material such as a glass epoxy resin, a fluorine resin, and a polyimide resin as a main component. The signal layer 2 includes a plurality of lines, and each of the lines can be formed from a material that contains a conductor such as copper.

In the multilayer substrate 1, a differential transmission line is constituted in a microstrip line structure, and for example, two lines 10 and 20, which form a differential pair in the signal layer 2, may be provided. Two signals (differential signals), of which phases are inverted from each other in a state in which the absolute values of each amplitude is equivalent, are respectively input to input terminals (for example, nodes N1 and N3) of the two lines 10 and 20, and two signals are respectively output from output terminals (for example, nodes N2 and N4) of the two lines 10 and 20. Differential transmission (parallel transmission) can be performed by taking a difference between the two signals from the two lines 10 and 20 with a ground potential of the ground layer 4 set as a reference.

It should be noted that each of the nodes N1, N2, N3, and N4 may be connected to a connection terminal of an element that is mounted on the multilayer substrate 1, may be connected to a via for electrical connection to another interconnection layer, or may be connected to a terminal of a connector, which is provided to the multilayer substrate 1, for external connection.

At this time, when two signals from output terminals of the two lines 10 and 20 have phases which are accurately opposite to each other (a phase difference of 180°), it is possible to accurately perform recovery of signals according to differential transmission, and it is possible to easily improve an SN ratio of a signal by increasing a ratio of a signal/a reference approximately two times a ratio in single transmission. However, when the two signals from the output terminals of the two lines 10 and 20 deviate from an opposite phase relationship, it is difficult to accurately perform recovery of a signal according to the differential transmission. Accordingly, it is desired to reduce a difference in transmission time of two signals in the two lines 10 and 20, and to suppress deterioration in differential characteristics of the two lines.

It can be considered that physical lengths of the two lines are made to be equal to each other so as to reduce a difference in transmission time of the two signals in the two lines. For example, the following layout can be considered. That is, a layout of a line having a shorter physical length between the two lines is partially changed into a meander shape, and the line having a shorter physical length is selectively bypassed so as to make the physical lengths of the two lines be equal to each other.

However, when one line between the two lines, which form the differential pair, is selectively set to the meander shape, partially, an interval between the one line and the other line greatly varies, and thus impedance in a differential mode is likely to rapidly vary. When the impedance in the differential mode rapidly varies, reflection due to impedance mismatch occurs at a portion of one line at which impedance rapidly varies, and thus signal transmission quality may deteriorate or signal transmission may be difficult.

Here, this embodiment can be intended to reduce a difference in electrical length between the two lines 10 and 20 in the multilayer substrate 1 by making a width of the line 20 having a shorter physical length be thicker than a width of the line 10 having a longer physical length. That is, it can be intended to reduce a difference in signal transmission time between the two lines 10 and 20 by adjusting the electrical length of the two lines 10 and 20 while retaining the impedance in the differential mode to be approximately constant by making an interval between the two lines 10 and 20 be approximately constant. In addition, the electrical length of a line represents a length obtained by standardizing the physical length of the line with a signal transmission speed.

Specifically, as illustrated in FIG. 1, the line 10 electrically connects the node N1 and the node N2 in the signal layer 2. The line 20 electrically connects the node N3 and the node N4 in the signal layer 2. An interval between the line 10 and the line 20 is approximately constant from the node N1 to the node N2. A width of the line 10 is approximately constant from the node N1 to the node N2. A width of the line 20 is approximately constant from the node N3 to the node N4. According to this, in a range from the node N1 to the node N2, it is possible to retain impedance in a differential mode to be approximately constant between the line 10 and the line 20, and thus it is possible to suppress occurrence of reflection due to impedance mismatch.

At this time, a mounting density of components in the multilayer substrate 1 may be made to be high so as to satisfy demand for downsizing of a product. In accordance with the demand, the line 10 and the line 20 may have a bent portion partway through a route from the node N1 to the node N2. With regard to the bending, when a bending side in a width direction is set as an inner side, and a side opposite to the bending side is set as an outer side, for example, the line 20 is located on an inner side in comparison to the line 10. With respect to the two lines 10 and 20, when comparing physical lengths which are measured by taking the center in a width direction along a longitudinal direction as indicated by a broken line in FIG. 1, a physical length from the node N3 to the node N4 in the line 20 is shorter than a physical length from the node N1 to the node N2 in the line 10.

In contrast, a width of the line 20 on a shorter physical length side is made to be thicker than a width of the line 10 on a longer physical length side. That is, with respect to a basic configuration in which an interval between the line 10 and the line 20 from the node N1 and N3 to the node N2 and N4 is approximately constant, and the widths of the lines 10 and 20 are substantially equal to each other and are constant, a change is made so that the width of the line 20 on a shorter physical length side becomes selectively thicker in a uniform manner from the node N3 to the node N4. According to this, with regard to capacitance per unit physical length, capacitance of the line 20 becomes greater than capacitance of the line 10, and characteristic impedance (=√{(inductance of line)/(capacitance of line)} of the line 20 becomes greater than characteristic impedance of the line 10. As a result, signal transmission delay per unit length in the line 20 becomes greater than signal transmission delay per unit length in the line 10, and a signal transmission speed in the line 20 becomes slower than a signal transmission speed in the line 10. Accordingly, an electrical length (=(physical length)/(transmission speed))) of the line 20 can be made to be close to an electrical length of the line 10. That is, it is possible to reduce a difference in the electrical length between the two lines 10 and 20 without changing the physical length of the lines 10 and 20 in the basis configuration, and it is possible to reduce a difference in signal transmission time between the two lines 10 and 20. According to this, with respect to the two lines 10 and 20, it is possible to reduce a difference in transmission time between two signals while retaining impedance in the differential mode to an approximately constant value.

Here, it is necessary to specify which line has a longer physical length between the two lines 10 and 20 so as to determine a line to be thicker with respect to the basis configuration in which the widths of the two lines 10 and 20 are equal to each other.

For example, as a method of specifying which line has a longer physical length between the two lines 10 and 20, the following method can be considered. That is, as illustrated in FIG. 1, the lines 10 and 20 are divided into a plurality of straight-line portions, and comparison is made for each portion.

For example, the line 10 has portions 11, 12, 13, 14, and 15. The portions 11, 12, 13, 14, and 15 are disposed between the node N1 and the node N2. The portion 11 is disposed between the node N1 and the portion 12, extends along +X direction by a length L11, and electrically connects the node N1 and the portion 12. The portion 12 is disposed between the portion 11 and the portion 13, extends by a length L12 in a state of being inclined in the +X direction and a +Y direction, and electrically connects the portion 11 and the portion 13. The portion 13 is disposed between the portion 12 and the portion 14, extends along the +Y direction by a length L13, and electrically connects the portion 12 and the portion 14. The portion 14 is disposed between the portion 13 and the portion 15, extends by a length L14 in a state of being inclined in a −X direction and the +Y direction, and electrically connects the portion 13 and the portion 15. The portion 15 is disposed between the portion 14 and the node N2, extends along the −X direction by a length L15, and electrically connects the portion 14 and the node N2. When the physical length of the line 10 is set as L1, the following Equation 1 is established.

$$L1 = L11 + L12 + L13 + L14 + L15 \qquad \text{Equation 1}$$

It should be noted that, when widths of the portions 11, 12, 13, 14, and 15 are set as W11, W12, W13, W14, and W15, respectively, an expression of W11≈W12≈W13≈W14≈W15 is satisfied.

For example, the line 20 has portions 21, 22, 23, 24, and 25. The portions 21, 22, 23, 24, and 25 are disposed between the node N3 and the node N4. The portion 21 is disposed between the node N3 and the portion 22, extends along the +X direction by a length L21, and electrically connects the node N3 and the portion 22. The portion 22 is disposed between the portion 21 and the portion 23, extends by a length L22 in a state of being inclined in the +X direction and the +Y direction, and electrically connects the portion 21 and the portion 23. The portion 23 is disposed between the portion 22 and the portion 24, extends along the +Y direction by a length L23, and electrically connects the portion 22 and the portion 24. The portion 24 is disposed between the portion 23 and the portion 25, extends by a length L24 in a state of being inclined in the −X direction and the +Y direction, and electrically connects the portion 23 and the portion 25. The portion 25 is disposed between the portion 24 and the node N4, extends along the −X direction by a length L25, and electrically connects the portion 24 and the node N4. When the physical length of the line 20 is set as L2, the following Equation 2 is established.

$$L2=L21+L22+L23+L24+L25 \quad \text{Equation 2}$$

It should be noted that, when widths of the portions 21, 22, 23, 24, and 25 are set as W21, W22, W23, W24, and W25, respectively, an expression of W21≈W22≈W23≈W24≈W25 is satisfied.

When comparing the line 10 and the line 20 for each portion, the following Equation 3 to Equation 7 are established.

$$L11 \approx L21 \quad \text{Equation 3}$$

$$L12 > L22 \quad \text{Equation 4}$$

$$L13 > L23 \quad \text{Equation 5}$$

$$L14 > L24 \quad \text{Equation 6}$$

$$L15 \approx L25 \quad \text{Equation 7}$$

According to Equation 1 to Equation 7, the following Equation 8 is established with respect to the physical length L1 of the line 10 and the physical length L2 of the line 20.

$$L2 < L1 \quad \text{Equation 8}$$

It is possible to specify that the physical length L2 of the line 20 is shorter than the physical length L1 of the line 10 by using Equation 8 that is obtained from comparison made for each straight-line portion, and it is possible to specify that a line to be thicker is the line 20.

It should be noted that, when intervals between the portions 11, 12, 13, 14, and 15, and the portions 21, 22, 23, 24, and 25 are set as G1121, G1222, G1323, G1424, and G1525, respectively, an expression of G1121≈G1222≈G1323≈G1424≈G1525 is satisfied.

Alternatively, as the method of specifying which line has a longer physical length between the two lines 10 and 20, the following method can be considered. That is, as indicated by a bold broken line in FIG. 2, curves CRV1 and CRV2 along the respective lines 10 and 20 are assumed, and comparison is made for an average value of the radius of curvature of each of the two curves.

In a case where a radius of a circle CR1, which is inscribed with the central line of the portions 12 and 13 of the line 10, is R1, and a radius of a circle CR3, which is inscribed with the central line of the portions 13 and 14 of the line 10, is R3, an average value AVR1 of a radius of curvature of the curve CRV1 according to the line 10 is expressed by the following Equation 9.

$$AVR1=(R1+R3)/2 \quad \text{Equation 9}$$

In a case where a radius of a circle CR2, which is inscribed with the central line of the portions 22 and 23 of the line 20, is R2, and a radius of a circle CR4, which is inscribed with the central line of the portions 23 and 24 of the line 20, is R4, an average value AVR2 of a radius of curvature of the curve CRV2 along the line 20 is expressed by the following Equation 10.

$$AVR2=(R2+R4)/2 \quad \text{Equation 10}$$

When comparing the radii R1 and R2 of the circles CR1 and CR2 which are approximately concentric to each other, the following Equation 11 is established.

$$R1 > R2 \quad \text{Equation 11}$$

When comparing the radii R3 and R4 of the circles CR3 and CR4 which are approximately concentric to each other, the following Equation 12 is established.

$$R3 > R4 \quad \text{Equation 12}$$

With respect to the average value AVR1 of the radius of curvature of the curve CRV1 and the average value AVR2 of the radius of curvature of the curve CRV2, the following Equation 13 is established from Equation 9 to Equation 12.

$$AVR2 < AVR1 \quad \text{Equation 13}$$

In the curve CRV1 and the curve CRV2, straight-line portions thereof are approximately equal to each other, and curve portions have lengths which are approximately proportional to the radii of curvature, respectively. According to this, the following Equation 14 is established with respect to a length L1c of the curve CRV1 and a length L2c of the curve CRV2.

$$L2c < L1c \quad \text{Equation 14}$$

In addition, the following Equation 15 is established with respect to the lengths L1c and L2c of the curves CRV1 and CRV2, and the physical lengths L1 and L2 of the lines 10 and 20.

$$L1c \approx L1 \quad \text{Equation 15}$$

$$L2c \approx L2 \quad \text{Equation 16}$$

With respect to the physical length L1 of the line 10 and the physical length L2 of the line 20, the following Equation 17 is established from Equation 14 to Equation 16.

$$L2 < L1 \quad \text{Equation 17}$$

It is possible to specify that the physical length L2 of the line 20 is shorter than the physical length L1 of the line 10 by using Equation 17 that is obtained from comparison made for the average value of radius of curvature of each of the curves along the respective lines 10 and 20, and it is possible to specify that a line to be thicker is the line 20.

In addition, when a line to be thicker is determined with respect to the basic configuration in which the widths of the two lines 10 and 20 are equal to each other, it is necessary to determine that the width is to be thicker to a certain extent. For example, in a case where the width of the lines 10 and 20 in the basic configuration is W1, and a line to be thicker is determined as the line 20, as illustrated in FIG. 3, the width of the line 20 is made to be thicker from W1 to W2 while retaining the width of the line 10 to W1. At this time, the width of the line 20 can be made to be thicker from W1 to W2 in a range that satisfies the following Equation 18.

$$W1 < W2 < \{(L1)/(L2)\} \times W1 \quad \text{Equation 18}$$

If the width W2 of the line 20 is set to be equal to or less than the width W1 of the line 10, a difference in electrical length between the lines 10 and 20 further increases in comparison to a case where the widths of the lines 10 and 20 are equivalent to each other, and a difference in signal transmission time between the two lines 10 and 20 increases. In addition, if the width W2 of the line 20 is set to be equal to or greater than "{(L1)/(L2)}×W1", rounding of a waveform that is transmitted through the line 20 increases, and thus it is difficult to satisfy a demand for a minimum signal level that can determine 0 and 1 which are defined in an eye pattern.

As described above, in the multilayer substrate 1 of this example, with respect to the basic configuration in which an interval between the line 10 and the line 20 from the node N1 and N3 to the node N2 and N4 is approximately constant, and the widths of the lines 10 and 20 are equivalent to each other and are constant, a change is made so that the width of the line 20 on a shorter physical length side becomes selectively thicker in a uniform manner, thereby constituting the two lines 10 and 20 that form a differential pair. According to this, it is possible to make the electrical length of the line 20 on a shorter physical length side close to the electrical length of the line 10 on a longer physical length side while retaining the interval between the two lines 10 and 20 to be approximately constant, and it is possible to reduce a difference in electrical length between the two lines 10 and 20 which form a differential pair. As a result, it is possible to retain impedance of a differential mode to be approximately constant, and it is possible to reduce a difference in signal transmission time between the two lines 10 and 20 which form the differential pair.

It should be noted that, in a case where the multilayer substrate includes a plurality of signal layers, the change, in which a width of a line on a shorter physical length side between two lines which form a differential pair is selectively made to be thicker in a uniform manner, can be made for each of the plurality of signal layers.

Figure 4:
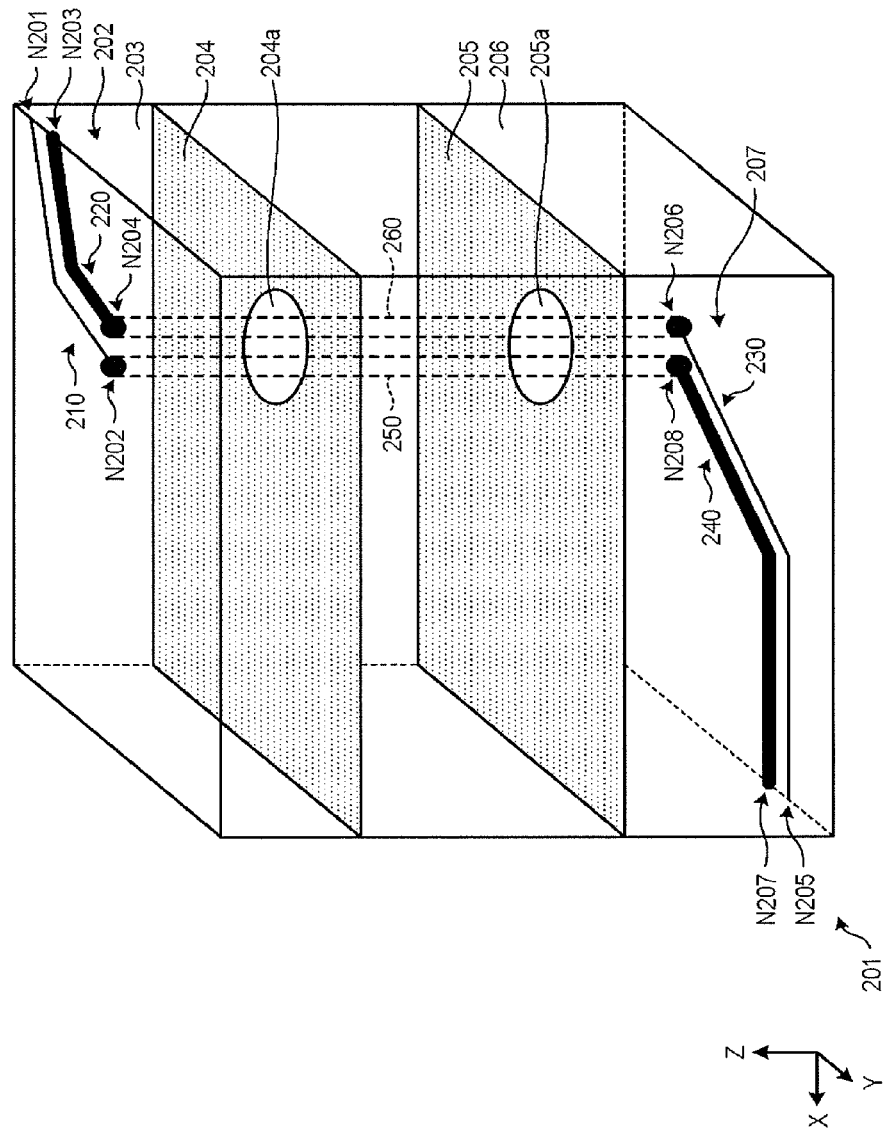
FIG. 4 is a perspective view illustrating a configuration of the multilayer substrate according to a modification example of the embodiment.

For example, a multilayer substrate 201 illustrated in FIG. 4 includes a signal layer 202, an insulating layer 203, a ground layer 204, a ground layer 205, an insulating layer 206, a signal layer 207, and vias 250 and 260. FIG. 4 is a perspective view illustrating a configuration of the multilayer substrate 201. In the multilayer substrate 201, the ground layer 205 is stacked on an upper side of the signal layer 207 with the insulating layer 206 interposed therebetween, and the signal layer 202 is stacked on an upper side of the ground layer 204 with the insulating layer 203 interposed therebetween. The ground layer 204 is disposed on an upper side of the ground layer 205. The signal layer 202 includes two lines 210 and 220 which form a differential pair. The line 210 electrically connects a node N201 and a node N202 in the signal layer 202. The line 220 electrically connects a node N203 and a node N204 in the signal layer 202. The signal layer 207 includes two lines 230 and 240 which form a differential pair. The line 230 electrically connects a node N205 and a node N206 in the signal layer 207. The line 240 electrically connects a node N207 and a node N208 in the signal layer 207. The via 250 extends in the Z direction to electrically connect the node N202 and the node N208. The via 260 extends in the Z direction to electrically connect the node N204 and the node N206. The ground layer 204 has a planar pattern that extends in a planar shape, and has an opening 204a that surrounds the via 250 and the via 260. The ground layer 205 has a planar pattern that extends in a planar shape, and has an opening 205a that surrounds the via 250 and the via 260.

Figure 5A:
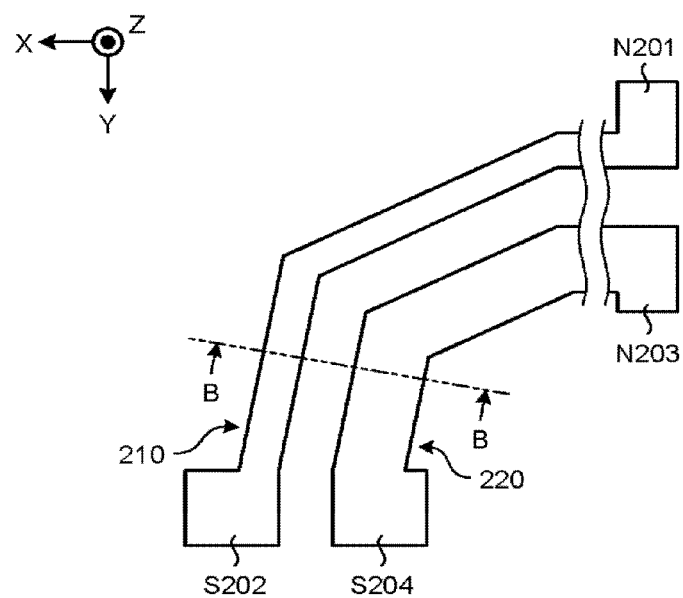
FIG. 5A and FIG. 5B are plan views illustrating the configuration of the multilayer substrate according to the modification example of the embodiment.

In the signal layer 202, as illustrated in FIG. 5A, an interval between the line 210 and the line 220 is approximately constant from the node N201 to the node N202. FIG. 5A is a plan view illustrating a configuration of the signal layer 202 in the multilayer substrate 201. A width of the line 210 is approximately constant from the node N201 to the node N202. A width of the line 220 is approximately constant from the node N203 to the node N204. According to this, in a range between the node N201 to the node N202, it is possible to retain impedance in a differential mode to be approximately constant between the line 210 and the line 220, and thus it is possible to suppress occurrence of reflection due to impedance mismatch.

At this time, with respect to the two lines 210 and 220, when comparing physical lengths which are measured by taking the center in a width direction along a longitudinal direction, a physical length L2' from the node N203 to the node N204 in the line 220 is shorter than a physical length L1' from the node N201 to the node N202 in the line 210.

Figure 6A:
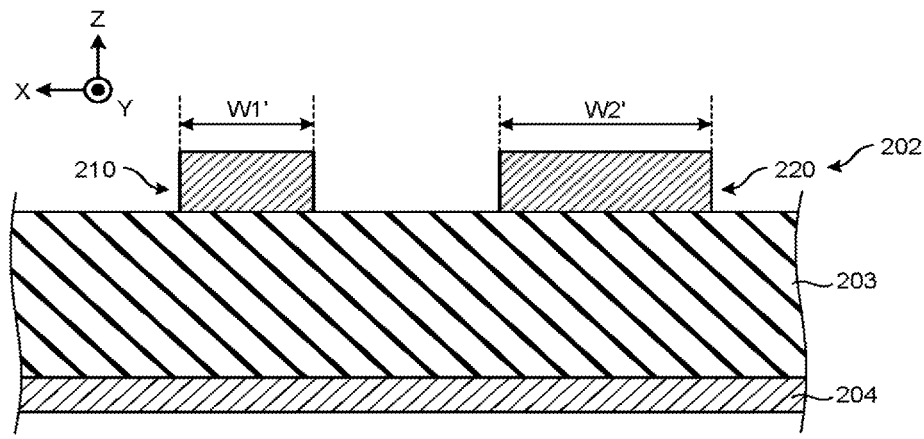
FIG. 6A and FIG. 6B are cross-sectional views illustrating a width of a signal line in the modification example of the embodiment.

In contrast, the width of the line 220 on a shorter physical length side is made to be thicker than the width of the line 210 on a longer physical length side. That is, in a case where the width of the lines 210 and 220 in a basic configuration, in which the widths of the two lines 210 and 220 are substantially equal to each other, is W1', and a line to be thicker is determined as the line 220, as illustrated in FIG. 6A, the width of the line 220 is made to be thicker from W1' to W2' while retaining the width of the line 210 to W1'. FIG. 6A is a cross-sectional view taken along line B-B in FIG. 5A, and illustrates the width of the signal lines 210 and 220. At this time, the width of the line 220 can be made to be thicker from W1' to W2' in a range that satisfies the following Equation 19.

$$W1' < W2' < \{(L1')/(L2')\} \times W1' \qquad \text{Equation 19}$$

If the width W2' of the line 220 is set to be equal to or less than the width W1' of the line 210, a difference in electrical length between the lines 210 and 220 further increases in comparison to a case where the widths of the lines 210 and 220 are substantially equal to each other, and a difference in signal transmission time between the two lines 210 and 220 increases. In addition, if the width W2' of the line 220 is set to be equal to or greater than "{(L1')/(L2')}×W1'", rounding of a waveform that is transmitted through the line 20 increases, and thus it is difficult to satisfy a demand for a minimum signal level that can determine 0 and 1 which are defined in an eye pattern.

Figure 5B:
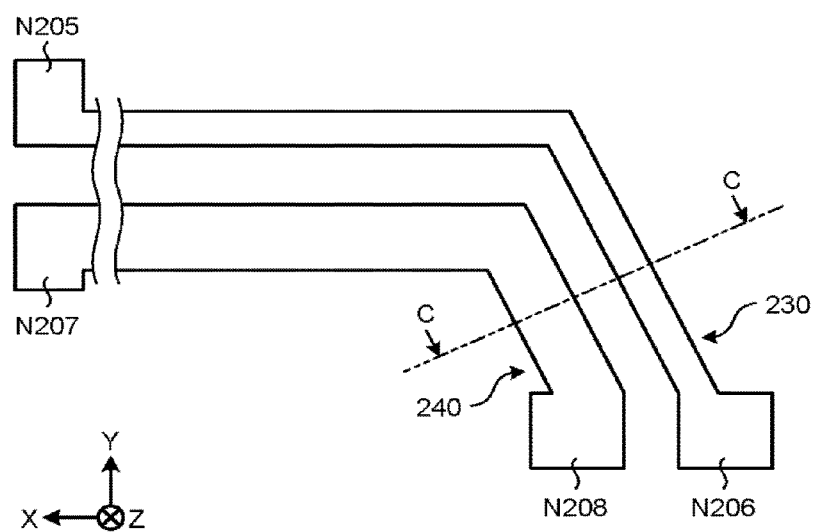

In the signal layer 207, as illustrated in FIG. 5B, an interval between the line 230 and the line 240 is approximately constant from the node N205 to the node N206. FIG. 5B is a plan view illustrating a configuration of the signal layer 207 in the multilayer substrate 201. A width of the line 230 is approximately constant from the node N205 to the node N206. A width of the line 240 is approximately constant from the node N207 to the node N208. According to this, in a range from the node N205 to the node N206, it is possible to retain impedance in a differential mode to be approximately constant between the line 230 and the line 240, and thus it is possible to suppress occurrence of reflection due to impedance mismatch.

At this time, with respect to the two lines 230 and 240, when comparing physical lengths which are measured by taking the center in a width direction along a longitudinal direction, a physical length L4 from the node N207 to the node N208 in the line 240 is shorter than a physical length L3 from the node N205 to the node N206 in the line 230.

Figure 6B:
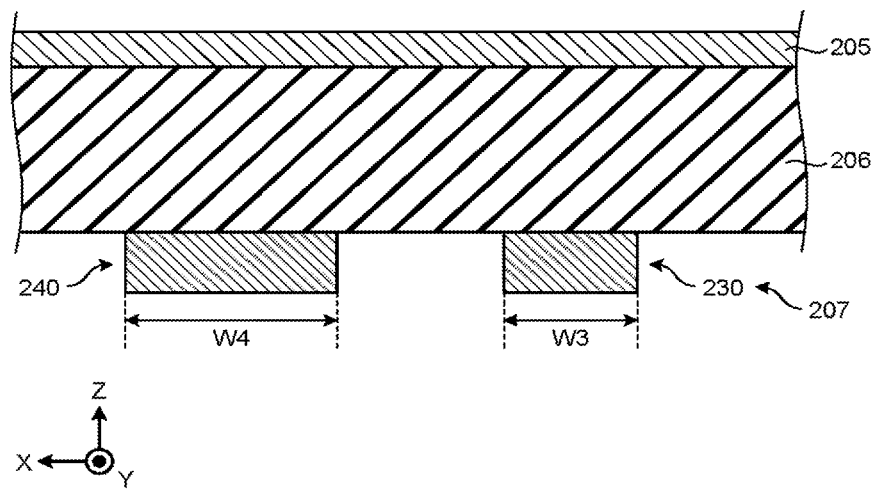

In contrast, the width of the line 240 on a shorter physical length side is made to be thicker than the width of the line 230 on a longer physical length side. That is, in a case where the width of the lines 230 and 240 in a basic configuration, in which the widths of the two lines 230 and 240 are substantially equal to each other, is W3, and a line to be thicker is determined as the line 240, as illustrated in FIG. 6B, the width of the line 240 is made to be thicker from W3 to W4 while retaining the width of the line 230 to W3. FIG. 6B is a cross-sectional view taken along line C-C in FIG. 5B, and illustrates the width of the signal lines 230 and 240. At this time, the width of the line 240 can be made to be thicker from W3 to W4 in a range that satisfies the following Equation 20.

$$W3 < W4 < \{(L3)/(L4)\} \times W3 \qquad \text{Equation 20}$$

If the width W4 of the line 240 is set to be equal to or less than the width W3 of the line 230, a difference in electrical length between the lines 230 and 240 further increases in comparison to a case where the widths of the lines 230 and 240 are substantially equal to each other, and a difference in signal transmission time between the two lines 230 and 240 increases. In addition, if the width W4 of the line 240 is set to be equal to or greater than "$\{(L3)/(L4)\} \times W3$", rounding of a waveform that is transmitted through the line 240 increases, and thus it is difficult to satisfy a demand for a minimum signal level that can determine 0 and 1 which are defined in an eye pattern.

Alternatively, in the multilayer substrate, a common mode filter may be further disposed to the two lines which form a differential pair. According to this, when a width of a line on a shorter physical length side between the two lines which form the differential pair in a signal layer is made to be selectively thicker in a uniform manner, it is possible to reduce common-mode noise, which may occur, with the common mode filter.

For example, in a multilayer substrate 301 illustrated in FIG. 7, a common mode filter 270 is disposed to two lines 10 and 20 which form a differential pair in the signal layer 2. The common mode filter 270 includes an inductance element 271, an inductance element 272, and a core 273. The inductance element 271 is electrically inserted into the line 20. For example, the inductance element 271 is a coil that is wound around a core 273. The inductance element 272 is electrically inserted into the line 30. For example, the inductance element 272 is a coil that is wound around the core 273 in a direction opposite to the direction in the inductance element 271. The core 273 magnetically couples the inductance element 271 and the inductance element 272. According to this, the common mode filter 270 can weaken magnetic flux due to a common-mode noise current that flows through the line 10, and a magnetic flux due to a common-mode noise current that flows through the line 20, and thus it is possible to reduce common-mode noise that may occur in the two lines 10 and 20.

Similarly, for example, in the multilayer substrate 201 illustrated in FIG. 4, the common mode filter may also be disposed to the two lines 210 and 220 which form the differential pair in the signal layer 202, and the common mode filter may also be disposed to the two lines 230 and 240 which form the differential pair in the signal layer 207. An internal configuration of each of the common mode filter may be the same as in the common mode filter 270 illustrated in FIG. 7.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A multilayer substrate, comprising
a signal layer that includes a first line and a second line which form a differential pair,
the first line electrically connecting a first node and a second node in the signal layer,
the second line electrically connecting a third node and a fourth node in the signal layer,
an interval between the first line and the second line being approximately constant from the first node to the second node,
a physical length from the third node to the fourth node in the second line being shorter than a physical length from the first node to the second node in the first line, and
a width of the second line being thicker than a width of the first line.

2. The multilayer substrate according to claim 1,
wherein the width of the first line is approximately constant from the first node to the second node, and
the width of the second line is approximately constant from the third node to the fourth node.

3. The multilayer substrate according to claim 1,
wherein an average value of a radius of curvature of a second curve along the second line is smaller than an average value of a radius of curvature of a first curve along the first line.

4. The multilayer substrate according to claim 3,
wherein the first curve and the second curve are bent to one direction side in a width direction, and
the second curve is located on the one direction side in comparison to the first curve.

5. The multilayer substrate according to claim 1,
wherein, if the width of the first line is set as W1, the width of the second line is set as W2, the physical length of the first line is set as L1, and the physical length of the second line is set as L2, then a relationship of $$W1 < W2 < \{(L1)/(L2)\} \times W1$$

is established.

6. The multilayer substrate according to claim 1, further comprising
a ground layer,
wherein the signal layer is disposed above the ground layer.

7. The multilayer substrate according to claim 6,
wherein the ground layer has a planar pattern that extends in a planar shape.

8. The multilayer substrate according to claim 1, further comprising
a common mode filter that is disposed to the first line and the second line.

9. The multilayer substrate according to claim 8,
wherein the common mode filter includes:
a first inductance element that is electrically inserted into the first line;
a second inductance element that is electrically inserted into the second line; and
a core that magnetically couples the first inductance element and the second inductance element.

10. The multilayer substrate according to claim 1,
wherein the first line and the second line transmit a radio-frequency differential signal.

11. The multilayer substrate according to claim 1, further comprising
a second signal layer that includes a third line and a fourth line which form a differential pair,
wherein the third line electrically connects a fifth node and a sixth node in the second signal layer,
the fourth line electrically connects a seventh node and an eighth node in the second signal layer,
an interval between the third line and the fourth line is approximately constant from the fifth node to the sixth node,
a physical length from the seventh node to the eighth node in the fourth line is shorter than a physical length from the fifth node to the sixth node in the third line, and
a width of the fourth line is thicker than a width of the third line.

12. The multilayer substrate according to claim 11,
wherein the width of the third line is approximately constant from the fifth node to the sixth node, and
the width of the fourth line is approximately constant from the seventh node to the eighth node.

13. The multilayer substrate according to claim 11,
wherein an average value of a radius of curvature of a fourth curve along the fourth line is smaller than an average value of a radius of curvature of a third curve along the third line.

14. The multilayer substrate according to claim 13,
wherein the third curve and the fourth curve are bent to one direction side in a width direction, and
the fourth curve is located on the one direction side in comparison to the third curve.

15. The multilayer substrate according to claim 11,
wherein, if the width of the third line is set as W3, the width of the fourth line is set as W4, the physical length of the third line is set as L3, and the physical length of the fourth line is set as L4, then a relationship of $$W3 < W4 < \{(L3)/(L4)\} \times W3$$

is established.

16. The multilayer substrate according to claim 11, further comprising
a ground layer,
wherein the signal layer is disposed above the ground layer, and
the second signal layer is disposed below the ground layer.

17. The multilayer substrate according to claim 16, further comprising:
a first via that connects one of the first node and the third node to the fifth node; and
a second via that connects the other of the first node and the third node to the seventh node,
wherein the ground layer has a planar pattern that extends in a planar shape, and has an opening that surrounds the first via and the second via.

18. The multilayer substrate according to claim 11, further comprising
a second common mode filter that is disposed to the third line and the fourth line.

19. The multilayer substrate according to claim 18,
wherein the second common mode filter includes:
a third inductance element that is electrically inserted into the third line;
a fourth inductance element that is electrically inserted into the fourth line; and
a second core that magnetically couples the third inductance element and the fourth inductance element.

20. The multilayer substrate according to claim 11,
wherein the first line and the second line transmit a radio-frequency differential signal, and
the third line and the fourth line transmit a radio-frequency differential signal.

* * * * *